United States Patent [19]

Kroeger, Jr. et al.

[11] 4,328,441
[45] May 4, 1982

[54] OUTPUT CIRCUIT FOR PIEZOELECTRIC POLYMER PRESSURE SENSOR

[75] Inventors: Frederick R. Kroeger, Jr.; Richard A. Norquist, both of St. Paul, Minn.

[73] Assignee: Minnesota Mining and Manufacturing Company, St. Paul, Minn.

[21] Appl. No.: 117,296

[22] Filed: Jan. 31, 1980

[51] Int. Cl.$^3$ .............................................. H01L 41/08
[52] U.S. Cl. ................... 310/319; 310/339; 310/800
[58] Field of Search .............. 310/339, 317, 319, 800; 340/365 A

[56] References Cited

U.S. PATENT DOCUMENTS

| | | | |
|---|---|---|---|
| 3,464,531 | 9/1969 | Herr et al. | 340/365 A X |
| 3,935,485 | 1/1976 | Yoshida et al. | 310/800 X |
| 3,940,637 | 2/1976 | Ohigashi et al. | 310/800 X |
| 4,234,813 | 11/1980 | Iguchi et al. | 310/800 X |

*Primary Examiner*—Mark O. Budd
*Attorney, Agent, or Firm*—Cruzan Alexander; Donald M. Sell; William D. Bauer

[57] ABSTRACT

A pressure sensitive apparatus for producing electrical signals on two electrodes having a layered structure consisting of a conductive layer, a piezoelectric polymer film layer, an electrode layer, an insulating layer, another electrode layer, another piezoelectric polymer film layer, and another conductive layer. The layered structure may be constructed from an insulating layer sandwiched between two piezoelectric polymer films each having an electrode on one surface thereof and having a conductive plane on the other surface thereof disposed on each side of the insulating layer with the electrodes in closest proximity to the insulating film. Further, support substrates may be disposed on each side of the piezoelectric polymer films, the support substrates having an opening where the electrodes are located. Still, further, the apparatus may be adapted for a pressure sensitive matrix keyboard having a plurality of keyboard switch positions arranged in a plurality of rows and columns where the electrodes are a strip constituting one of the rows and columns, respectively, of the keyboard switch positions. The piezoelectric polymer film may be polyvinylidene fluoride and the layered structure may be integrally bonded or physically sandwiched together and may have connected to it an electrical sensing circuit suitable for amplifying a small charge pulse induced by the strain upon the piezoelectric polymer film.

10 Claims, 14 Drawing Figures

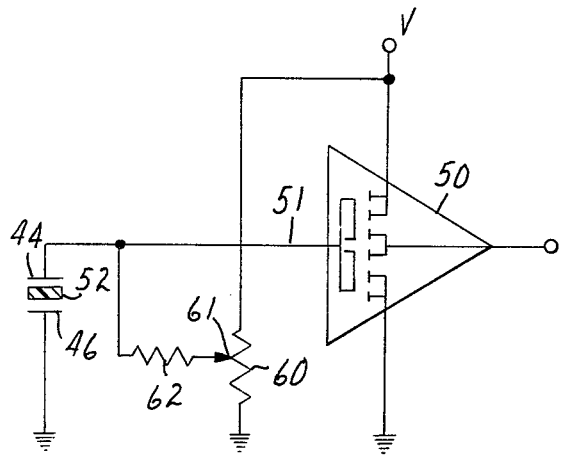
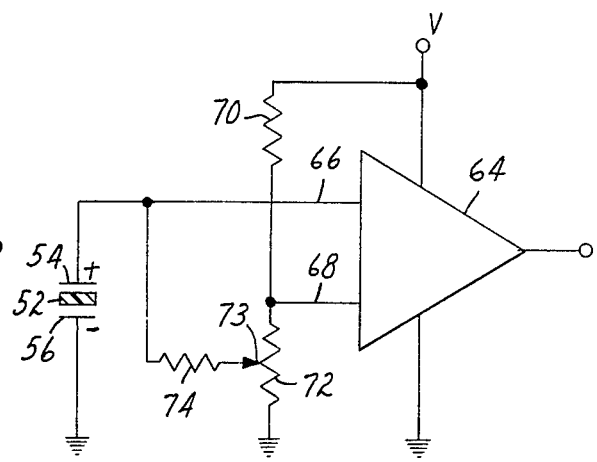
FIG. 4          FIG. 5
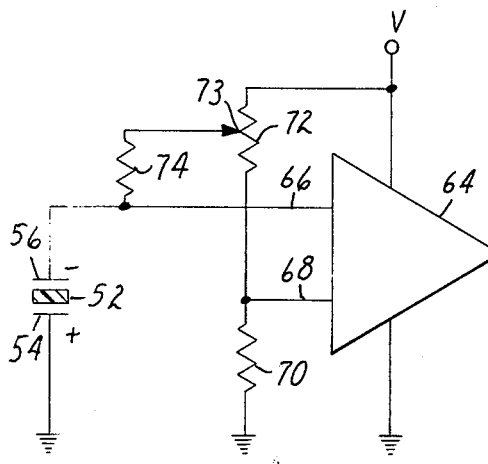
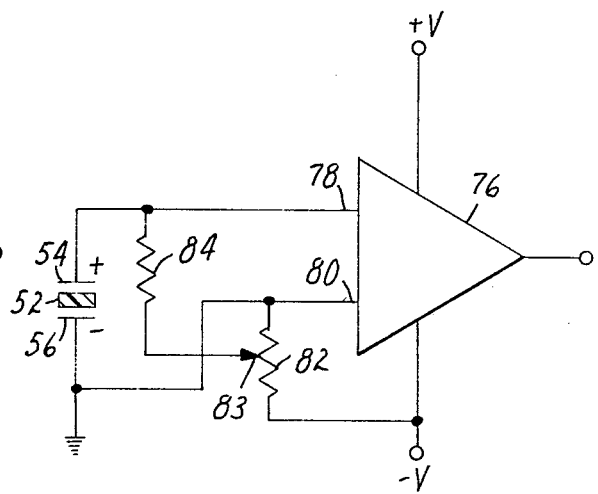
FIG. 6          FIG. 7
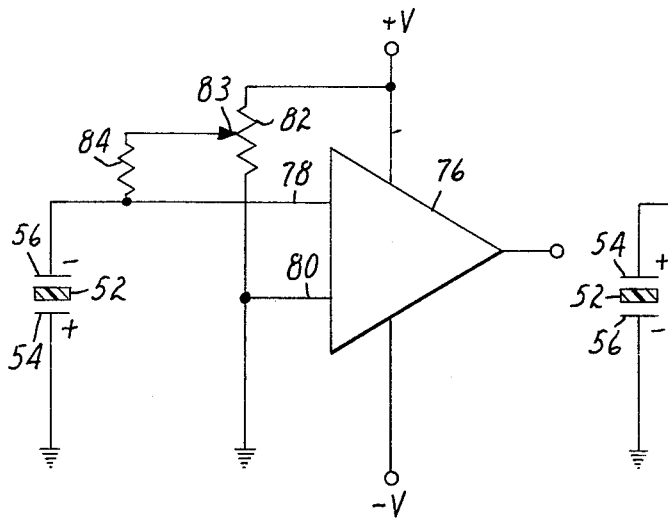
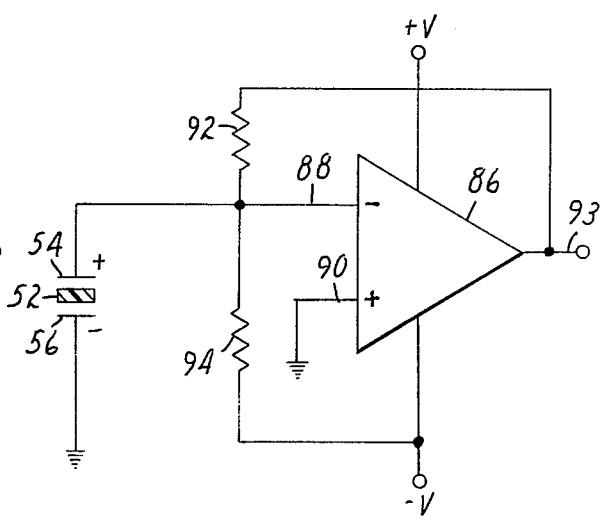
FIG. 8          FIG. 9

OUTPUT CIRCUIT FOR PIEZOELECTRIC POLYMER PRESSURE SENSOR

BACKGROUND OF THE INVENTION

The present invention relates generally to electrical switches, and more particularly to non-contact piezoelectric switches and interface circuits therefor.

Switches are increasingly being used in a variety of application and particularly in groups for the control of household appliances, industrial control applications, and alphanumeric keyboards, for example. For these applications, a small size low cost, high reliability switch, which is relatively insensitive to outside electromagnetic interference, is desired.

Conventional metal contact switches have, of course, been used for some time. With these conventional metal contact switches, the contact resistance tends to increase with age, and also is affected by external environmental conditions, such as temperature and moisture. This tends to create long-term reliability problems due to increasing contact resistance. An example of a multiple contact switching apparatus is U.S. Pat. No. 3,240,885 (Grunfelder, et al.) Multiple Switching Apparatus, issued Mar. 15, 1966.

Non-contact switches have also existed for some time. An example of such a non-contact touch switch would be a capacitance sensor. However, in order for capacitance sensors to work properly, the touch surface must be kept clean from dirt, grease, or other contaminants. Further, the capacitance sensor might not work if the operator is wearing gloves. A still further disadvantage with capacitance sensors is that most are not readily configured into a matrix array, and further that they provide no tactile sensation of switch activation.

To solve some of these problems, non-contact piezoelectric switches have been developed. In general, an impact imparted upon a piezoelectric ceramic generates a voltage which may be utilized to indicate switch closure. Examples of these piezoelectric switches are U.S. Pat. No. 4,078,187 (Kanisawa) Piezoelectric Switching Device, issued Mar. 7, 1978; U.S. Pat. No. 3,648,279 (Watson) Multielectrode Transducer Element, issued Mar. 7, 1972; and U.S. Pat. No. 3,303,290 (Suloway) Signaling Arrangements Employing Piezoelectric Devices. An improved type of non-contact piezoelectric switch has replaced the piezoelectric ceramic material with a piezoelectric polymeric material; for example, polyvinylidene fluoride. Some of these piezoelectric polymeric switches have been arranged in keyboard type arrangements. An example is U.S. Pat. No. 3,935,485 (Yoshida, et al.) entitled "Piezoelectric Key Board Switch" issued Jan. 27, 1976, which includes a single layer of piezoelectric polymer film having electrodes on both surfaces. A second example is U.S. Pat. No. 3,940,637 (Ohigashi, et al.) Polymeric Piezoelectric Key Actuated Device, issued Feb. 24, 1976, which also includes a single piezoelectric polymer film having electrodes on both surfaces thereof. Other examples of piezoelectric non-contact switches include U.S. Pat. No. 3,382,338, (Arseneault, et al.) Push Button Actuator for Elastomeric Switch, issued May 7, 1968; U.S. Pat. No. 3,798,473 (Murayama, et al.) Polymer-Type Electro-Acoustic Transducer Element, issued Mar. 19, 1974; and U.S. Pat. No. 3,832,580 (Yamamuro, et al.) High Molecular Weight, Thin Film Piezoelectric Transducers, issued Aug. 27, 1974.

A disadvantage to the above-described apparatus, especially when configured in a multi-layer piezoelectric polymer film structure is that the devices are not shielded and are therefore, sensitive to outside electromagnetic disturbances. Since the signal generated by the strained piezoelectric polymer film material is relatively small the device is particularly sensitive to outside interference.

Since the signal pulse generated by the strained piezoelectric polymeric material is relatively small, it therefore needs to be amplified by associated electronic circuitry in order to produce a signal which may be transmitted to other electronic components to indicate switch closure. An example of such associated electrical circuitry is illustrated in U.S. Pat. No. 4,078,187, (Kanisawa, et al.) Piezoelectric Switching Device, issued Mar. 7, 1978. A disadvantage in this electrical circuit, however, is that it is not as sensitive as possible, and its threshold is not readily adjustable.

SUMMARY OF THE INVENTION

The present invention provides a pressure sensitive apparatus for producing electrical signals on two electrodes. The apparatus is constructed in successive layers of a conductive layer adapted to be connected to ground, a piezoelectric polymer film layer, an electrode layer, having at least one electrode, an insulating layer, another electrode layer having at least one electrode, another piezoelectric polymer film layer and another conductive layer adapted to be connected to ground.

The piezoelectric polymer film layer may be constructed of polyvinylidene fluoride and the apparatus may also further include support layers sandwiching the layers previously described, each having an opening at the position where the two electrodes are located. The layers can be integrally bonded together or the layers may be held together by the mechanically affixing of the support layers to each other by a combination thereof.

The layered structure just described may be constructed by taking an insulating layer and sandwiching that insulating layer between two piezoelectric polymer films, each having one of the electrodes on one surface thereof and having a conductive plane on the other surface thereof, adapted to be connected to ground with the electrodes in closest proximity to the insulating film.

The apparatus may also have an electrical sensing circuit coupled to one of the two electrodes and to its associated conductive plane utilized as signal ground for amplifying the electrical signal. This electrical sensing circuit may be either a high impedence voltage sensing interface or may be a low impedence current sensing interface. Both interfaces may be adjustable for sensitivity.

One high impedence interface electrical sensing circuit is an MOS digital gate adapted to be powered from a power source having a voltage and a signal ground, the digital gate having a signal input and a signal output with the signal input coupled to the electrode, a resistance coupled between the voltage and the signal ground and having an adjustable tap to bias the digital gate, and a resistance coupled between the signal input and the adjustable tap to provide an adjustment of the bias of the digital gate.

A further electrical sensing circuit may be constructed from a comparator adapted to be powered from a power source having a voltage and a signal ground and having first and second signal inputs and a signal output, the first signal input being coupled to the electrode, a first resistance coupled between the voltage and the second signal input, a second resistance coupled between the second signal input and the signal ground and having an adjustable tap, and a third resistance coupled between the first signal input and the adjustable tap. This provides an adjustable bias for the comparator.

A further electrical sensing circuit may be constructed from a comparator adapted to be powered from a power source having a voltage and a signal ground and having first and second signal inputs and a signal output. The first signal input is coupled to the electrode. A first resistance is provided between the second signal input and signal ground, a second resistance having an adjustable tap is provided between the second signal input and the voltage and a third resistance is provided between the first signal input and the adjustable tap. This provides an adjustable bias for the comparator.

A still further electrical sensing circuit may be constructed from a comparator adapted to be powered from a power source having a positive voltage and a negative voltage, and having first and second signal inputs and a signal output. The first signal input is coupled to the electrode and the second signal input is coupled to signal ground, a first resistance having an adjustable tap is coupled between the second signal input and the negative voltage and a second resistance is coupled between the first signal input and the adjustable tap. This provides an adjustable bias for the comparator.

A still further electrical sensing circuit may be constructed from an operational amplifier adapted to be powered from a power source having a positive voltage and a negative voltage, and having first and second signal inputs and a signal output. The first signal input is coupled to the electrode and the second signal input is coupled to a signal ground. A first resistance is coupled between the second signal input and the positive voltage and the first resistance has an adjustable tap. A second resistance is coupled between the first signal input and the adjustable tap providing an adjustable bias for the operational amplifier.

A still further electrical sensing circuit may be constructed from an operational amplifier adapted to be powered from a power source having a positive voltage and a negative voltage, the operational amplifier having an inverting input and a non-inverting input and a signal output, the inverting input being coupled to the electrode, and the non-inverting input being coupled to signal ground. A first resistance is coupled between the signal output and the inverting input and a second resistance is coupled between the inverting input and the negative voltage.

A still further electrical sensing circuit may be constructed from an operational amplifier adapted to be powered from a power source having a positive voltage and a negative voltage and having an inverting input, a non-inverting input and a signal output. The inverting input is coupled to the electrode and the non-inverting input is coupled to signal ground. A first resistance is coupled between the signal output and the inverting input, and a second resistance is coupled between the inverting input and the positive voltage.

And a still further electrical sensing circuit may be constructed from a "Norton" amplifier, adapted to be powered from a power source having a positive voltage and a signal ground, the "Norton" amplifier having an inverting input and a non-inverting input and a signal output, the inverting input being coupled to the electrode, and a resistance being coupled between the non-inverting input and the positive voltage.

And a still further electrical sensing circuit may be constructed from a "Norton" amplifier adapted to be powered from a power source having a positive voltage and a signal ground, and having an inverting input, a non-inverting input and a signal output. The non-inverting input is coupled to the electrode and a resistance is coupled between the inverting input and the positive voltage.

And a still further electrical sensing circuit may be constructed from a "Norton" amplifier adapted to be powered from a power source having a positive voltage and a signal ground, and having an inverting input, a non-inverting input and a signal output. The inverting input is coupled to the electrode and a first resistance is coupled between the non-inverting input and the positive voltage, and a second resistance is coupled between the inverting input and the positive voltage. The first resistance will generally be greater than the second resistance.

And a still further electrical sensing circuit may be constructed from a "Norton" amplifier adapted to be powered from a power source having a positive voltage and a signal ground, and having an inverting input, a non-inverting input and a signal output. The non-inverting input is coupled to the electrode and a first resistance is coupled between the inverting input and the positive voltage, and a second resistance is coupled between the non-inverting input and the positive voltage. Again, the first resistance is generally greater than the second resistance.

The apparatus for producing an electrical signal may be configured in a matrix keyboard, having switch positions arranged in a plurality of rows and columns. Such a pressure sensitive keyboard switch is comprised of an insulating film, two piezoelectric polymer films each having electrodes on one surface thereof and having a conductive plane on the other surface thereof, adapted to be connected to ground, one disposed on each side of the insulating film with the electrodes in closest proximity to the insulating film with each of the electrodes on one of the two piezoelectric polymer films being a strip and constituting one of the rows of the keyboard switch positions and each of the electrodes on the other of the two piezoelectric polymer films, being a strip constituting one of the columns of the keyboard switch positions. The apparatus also includes two support substrates, each having an opening at each of said keyboard switch positions, one of the two support substrates disposed on each side of the two piezoelectric polymer films.

Such an apparatus provides all of the advantages of using piezoelectric polymeric materials. It is suitable for matrix encoding and provides outside ground planes to provide for electrical shielding. Further, it is also easier to insulate the described apparatus because of the ground planes being in existence on the outside of the layered structure instead of signal electrodes.

The sensing circuits described provide both a high impedance interface which is voltage sensitive and adjustable, and current sensing low impedance interface. The electrical sensing circuits coupled to the layered structure, allows the complete structure to simulate an ordinary contact switch, and which provides none of the disadvantages of an ordinary contact switch.

The structure described does not suffer from contact oxidation. The functioning of the structure is insensitive to an operator wearing gloves, and is insensitive to the build-up of dirt and grease.

BRIEF DESCRIPTION OF THE DRAWINGS

The foregoing objects, advantages, construction and operation of the present invention will become more readily apparent from the following description and accompanying drawings in which:

FIG. 4 is one electrical sensing circuit featuring an adjustable MOS circuit;

FIG. 5 is an electrical sensing circuit featuring a unipolar operational amplifier;

FIG. 6 is an electrical sensing circuit featuring an alternative unipolar operational amplifier;

FIG. 7 is an electrical sensing circuit featuring a bipolar operational amplifier;

FIG. 8 is an electrical sensing circuit featuring an alternative bipolar operational amplifier;

FIG. 9 is an electrical sensing circuit featuring a current actuated operational amplifier;

DESCRIPTION OF THE PREFERRED EMBODIMENTS

Figure 1:
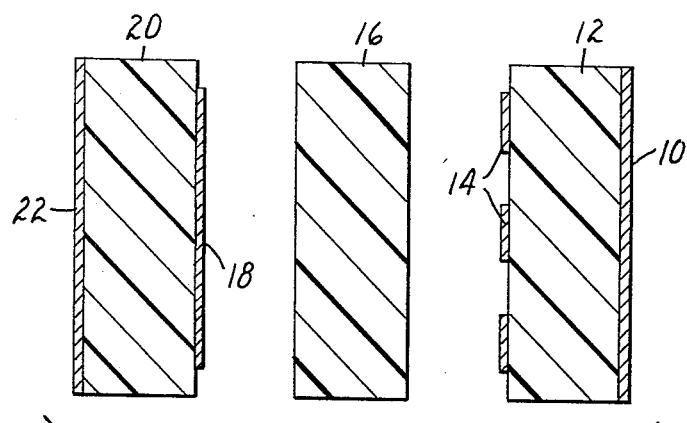
FIG. 1 is a cross-sectional view of the layered structure of the non-contact piezoelectric switch.

FIG. 1 illustrates a preferred embodiment for obtaining the layered piezoelectric structure. The layers consist of a conductive plane 10, a piezoelectric polymer film 12, an electrode layer 14, an insulating layer 16, another electrode layer 18, another piezoelectric polymer film 20, and another conductive plane 22. This particular layered structure may be accomplished by taking the insulating layer 16 and sandwiching it with two piezoelectric polymer films 12 and 20, each coated with a conductive plane 10 and 22 on one side and coated with at least one electrode 14 and 18 on the other side. The sandwich is then brought together with the electrode layers 14 and 18 in closest proximity to the insulating layer 16. The resulting sandwich provides the conductive planes 10 and 22 on the outside surfaces of the structure. This allows both for immunity from electromagnetic interference, and for ease of insulating the structure to support substrates.

The insulating layer 16 in FIG. 1 is constructed from any thin insulating film such as thin polyethylene or thin mylar. If polyethylene is used a thickness of about 25 micrometers is preferred. The piezoelectric polymer films 12 and 20 are constructed of polyvinylidene fluoride and in a preferred embodiment are each approximately 25 micrometers thick. This is thick enough to provide for mechanical stability and for electrical output but still thin enough to allow for deflection upon stress by an operator. The conductive planes 10 and 22 are metallized, as, for example, nickel, or aluminum. In a preferred embodiment aluminum is deposited in a layer approximately 0.1 micrometers thick. The electrodes 14 and 18 are deposited on the piezoelectric polymer films 12 and 20 in the desired pattern and are be comprised of a suitable metal, again for example, nickel or aluminum. In a preferred embodiment aluminum is deposited in a layer approximately 0.1 micrometers thick. Again this thickness is chosen to provide physical stability.

Figure 2:
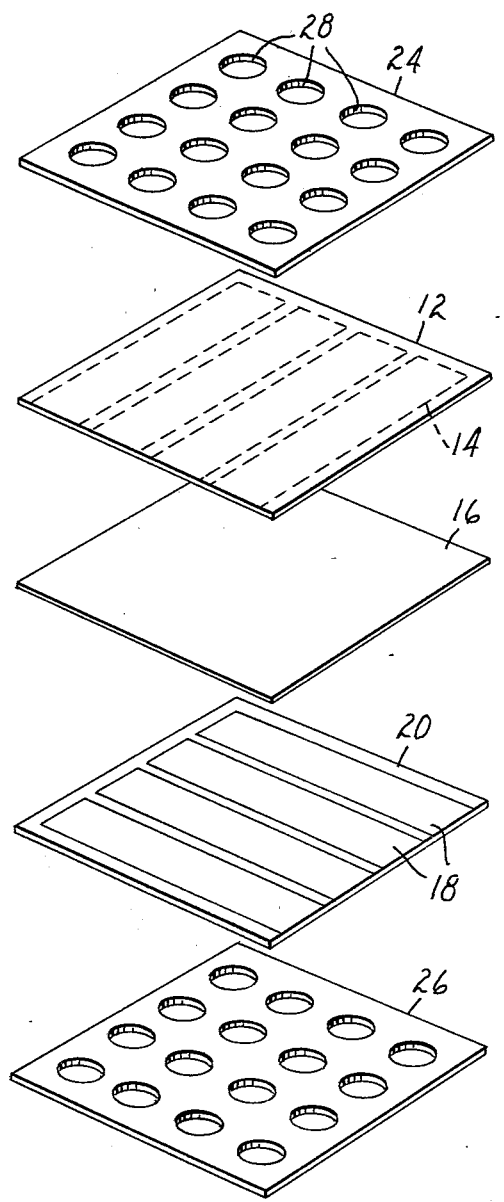
FIG. 2 is an exploded perspective view of the layered structure.

FIG. 2 represents a perspective view of an exploded layered structure. Again, the insulating layer 16 is provided in the middle of the structure with two piezoelectric polymer films 12 and 20 provided on each side. For ease of illustration, the two conductive planes 10 and 22 are not specifically shown. The electrode layer 18 is shown deposited on the top of piezoelectric polymer film layer 20 and the electrode pattern layer 14 is shown by dotted lines deposited on the lower side of piezoelectric polymer film 12. Notice that this construction places the electrode layers 14 and 18 in closest proximity to insulating layer 16. It is also to be noted that the electrode pattern 14 consists of a plurality of strips while the electrode pattern 18 also consists of a plurality of strips positioned orthogonal to the strips of electrodes 14. This allows a matrix encoded keyboard switch arrangement whereby the electrode pattern 14 represents the rows of switch positions, and the electrode pattern 18 represents the columns of the switch positions. Thus, the activation of any individual switch position would activate one row of electrode layer 14 and one column of electrode layer 18.

This layered structure in FIG. 2 is further sandwiched together by two support substrates 24 and 26. These support substrates are shown having openings 28 at each switch position in the matrix. This allows contact with the layered structure at each individual switch position and the piezoelectric film to be strained producing an electrical signal on the electrode layers 14 and 18. These support substrates 24 and 26 may be constructed of a punched aluminum sheet, a punched or molded plastic sheet or other suitably, relatively rigid material to provide support for the polymeric layered structure. Support substrates 24 and 26 are shown with openings 28 punched out or molded out to provide for the depression of the piezoelectric layered structure upon operator contact to provide for straining the piezoelectric polymeric material. An alternative embodiment would provide for one of the support substrates, for example, support substrate 26 instead of having complete openings 28 to have a flexible covering, a recessed area or a simple dimple to allow for depression of the piezoelectric polymeric material.

Although FIG. 2 illustrates openings 28 as complete passages, it is to be emphasized that the purpose of the openings 28 is to allow the piezoelectric polymer film 12 and 20 to be physically strained at individual switch positions. This requires that the piezoelectric polymer film 12 and 20 be allowed to deflect from both support substrates 24 and 26 and that access for straining be allowed from one support substrate, e.g., 24. Thus, the scope of the present invention contemplates flexible substances and other straining apparatus in place of complete passages as openings 23 in support substrate 24 and contemplates an even broader range of materials as openings 28 in support substrate 26. In addition to flexible substances the openings 28 in support substrate 26 may comprise simply a recess, a concave socket or a bubble which would allow the piezoelectric film 12 and 20 to deflect while being strained from the opposite side.

Figure 3:
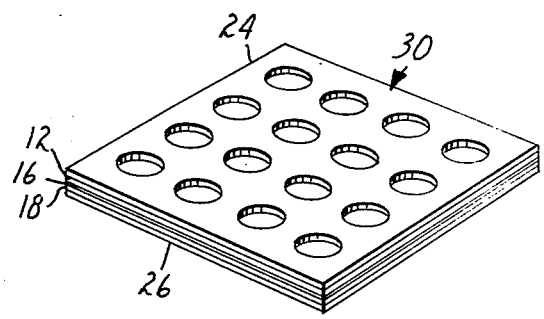
FIG. 3 is a perspective view of an assembled layered structure.

A perspective view of the completely assembled layered structure 30 is illustrated in FIG. 3. The layers may be held together merely by pressure between the support substrates which would be affixed to each other mechanically, or with a suitable adhesive bonding between the layers which could include thermal or ultrasonic bonding of the piezoelectric film layer structure.

In a preferred embodiment a combination of bonding and support substrate pressure is utilized. Each piezoelectric polymer film including the conductive plane and the electrodes integrally bonded to its associated support substrate. The resulting three piece structure (two parts of piezoelectric polymer films bonded to a support substrate and one part insulating layer) is then sandwiched together utilizing pressure from the outside support substrates which are mechanically affixed to each other, for example with screws or similar device.

Pressure on the individual switch position induces a strain in the piezoelectric polymer films. This strain causes a change in the film net polarization resulting in a charge on the electrodes covering the strained area. The charge signal is processed either as a voltage by high impedance electrical interface, or as a current by a low impedance electrical interface. In either case, an electrical sensing circuit is coupled to one of the electrodes and to its associated conductive plane preferably at the edges of the piezoelectric polymeric material. For the purposes of these electrical sensing circuits, the conductive plane serves a signal ground for its associated electrode, namely all of the electrodes located on the electrode layer nearest the particular conductive plane.

One such electrical sensing circuit providing an adjustable sensitivity high-impedance interface to the electrodes as illustrated in FIG. 4. Here a single input MOS digital gate, for example, a CMOS hex inverter Type 4069 manufactured by National Semiconductor is shown connected between a positive voltage source and signal ground. The digital gate may alternatively be part of a more complex logic element. The piezoelectric polymer film material 52 is shown having an electrode 44 and a conductive plane 46. Electrode 44 is coupled directly to the input 51 of gate 50. Conductive plane 46 is coupled directly to signal ground. Resistor 60, coupled between the positive supply of gate 50 and signal ground, provides a bias for the input 51 of gate 50. Resistor 60 has an adjustable tap 51 and resistance 62 is shown connected between input 51 and adjustable tap 61. Resistor 62 is preferably on the order of 10 megaohms and resistor 60 is preferably small relative to resistor 62, for example on the order of 100 kilohms. This provides a bias for input 51 by providing a quiescent voltage on input 51 so that the charge necessary to be provided by the piezoelectric polymer material 52 is small because only a small voltage is required in addition to the quiescent voltage on input 51 to provide the digital threshold for gate 50. Thus less pressure is required upon the piezoelectric polymeric material 52 and the apparent touch sensitivity is increased.

FIGS. 5 through 14 illustrate electrical sensing circuits in which a polarity of electrode for the piezoelectric polymer is indicated and is important. In all cases the polarity is indicated by positive electrode 54 and negative electrode 56. It is to be understood, however, that the electrical sensing circuits are always connected utilizing an electrode and the associated conductive plane. The conductive plane is always the side coupled to signal ground. For ease of illustration, polarity of the piezoelectric film 52 is merely indicated by positive electrode 54 and negative electrode 56 without regard to which is actually the conductive plane. It is recognized, of course, that the polarity achieved may be reversed by straining the piezoelectric film in the opposite direction.

FIG. 5 illustrates a similar adjustable sensitivity high impedance electrical sensing circuit as in FIG. 4. Here a comparator 64 with inputs 66 and 68 is connected between a positive voltage source and signal ground. An example of a comparator circuit 64 is type LM393 manufactured by National Semiconductor. Alternatively an operational amplifier with no feedback may be utilized to provide the comparison function. An example of an operational amplifier used as a comparator is type LM358 manufactured by National Semiconductor. The piezoelectric polymeric material 52 is shown having a positive electrode 54 and a negative electrode 56. Positive electrode 54 is coupled to input 66 while negative electrode 56 is coupled directly to signal ground. Resistor 70 is coupled between the positive supply voltage and input 68, and resistor 72 is coupled between input 68 and signal ground. Resistor 72 also has an adjustable tap 73. Resistor 74 is coupled between input 66 and signal groun. Resistor 74 is preferably 10 megaohms and resistors 70 and 72 are preferably 50 kilohms each. Resistors 70, 72 and 74 provide an adjustable bias for operational amplifier 64 to provide for increased sensitivity and adjustable senesitivity in much the same manner that resistors 60 and 62 did in FIG. 4 for gate 50.

FIG. 6 illustrates an alternative electrical sensing circuit similar to that circuit illustrates in FIG. 5. However in FIG. 6, positive electrode 54 of piezoelectric polymer film 52 is coupled to signal ground while negative electrode 56 is coupled to input 66 of comparator 64. Resistors 70 and 72 are reversed, however, to account for the opposite polarity of the film 52. This positions resistor 74, which is still coupled to adjustable tap 73, between input 68 and the positive supply voltage.

A similar circuit is illustrated in FIG. 7 using a bipolar powered comparator 76 connected between a positive voltage source and a negative voltage source. Again, an operational amplifier with no feedback may be used as a comparator. Again, a piezoelectric polymeric material 52 is shown having a positive electrode 54 and a negative electrode 56. Positive electrode 54 is coupled to input 78 and negative electrode 56 is coupled to input 80 of comparator 76. Input 80 is also made reference to signal ground. Resistor 82 is coupled between the negative supply voltage and input 80. Resistor 82 has an adjustable tap 83 and provides for a bias for input 80. Resistor 84 is coupled between input 78 and the adjustable tap 83 and provides for an adjustable bias for negative input 78. Resistor 84 is preferably 10 megaohms and resistor 82 is preferably smaller as for example 100 kilohms.

FIG. 8 illustrates an alternative electrical sensing circuit which is similar to that circuit illustrated in FIG. 7. However in FIG. 8, positive electrode 54 is coupled to signal ground while negative electrode 56 is coupled to input 66. To account for the change in polarity, resistors 82 and 84 have been reversed.

FIG. 9 illustrates a similar bipolar powered operational 86 which again is coupled between a positive supply voltage and a negative supply voltage, which provides a low impedance interface to provide a current sensing circuit. Again, piezoelectric polymeric material 52 has a positive electrode 54 and a negative electrode 56. Positive electrode 54 is coupled to inverting input 88 while negative electrode 56 is coupled to non-inverting input 90 which is also referenced to signal ground. Bias resistor 92, preferably several megaohms, is coupled between output 93 of the operational amplifier 86 and inverting input 88. Bias resistor 94, also preferably several megaohms, is coupled between negative input 88 and the negative supply voltage. Both resistor 92 and resistor 94 may be adjusted or made adjustable to allow for variable sensitivity.

Figure 10:
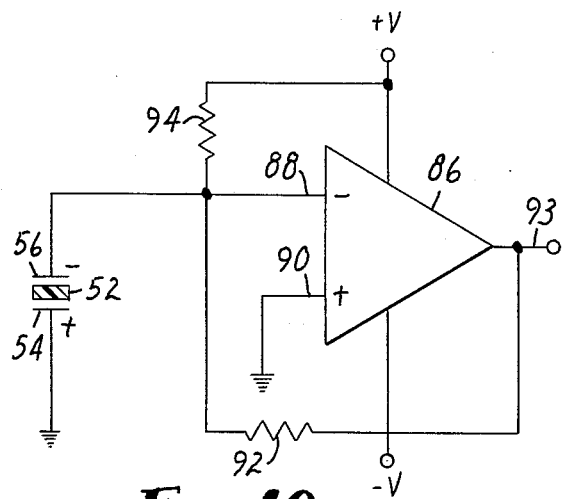
FIG. 10 is an electrical sensing circuit featuring an alternative current activated operational amplifier.

FIG. 10 illustrates an alternative electrical sensing circuit which is similar to FIG. 9. However, in FIG. 10 positive electrode 54 is coupled to signal while negative electrode 56 is coupled to inverting input 88. To account for the change in polarity resistor 94 is coupled to the positive supply voltage rather than the negative supply voltage.

Figure 11:
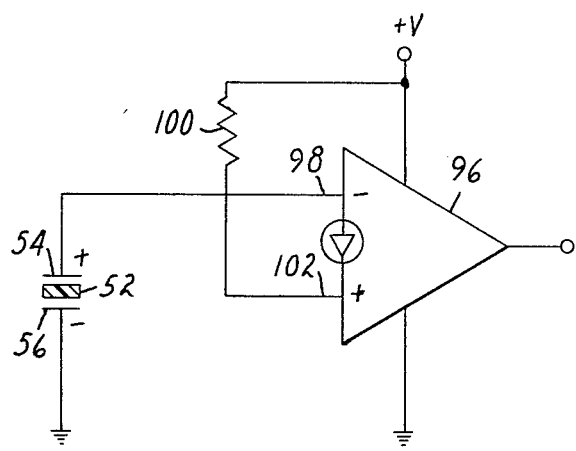
FIG. 11 is an electrical sensing circuit featuring a "Norton" operational amplifier.

In FIG. 11 a similar circuit is illustrated. This time using a "Norton" amplifier, for example, Type No. LM 3900 manufactured by National Semiconductor. Again, piezoelectric polymeric material 52 is shown having a positive electrode 54 and a negative electrode 56. The "Norton" amplifier 96 is connected between a positive supply voltage and signal ground. Positive electrode 54 is coupled to inverting input 98 and negative electrode 56 is coupled to signal ground. Bias is provided by resistor 100, preferably in the range of 500 kilohms to 10 megaohms coupled between non-inverting input 102 and positive supply voltage. Resistor 100 may be adjusted of made adjustable to provide for variable sensitivity.

Figure 12:
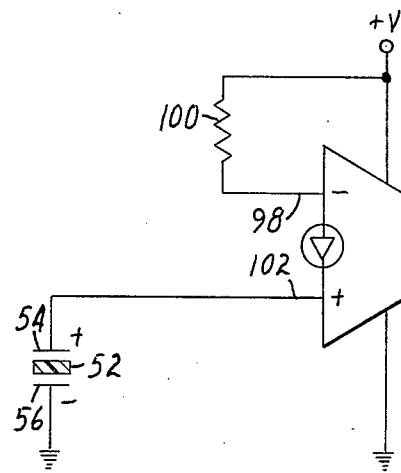
FIG. 12 is an electrical sensing circuit featuring an alternative "Norton" operational amplifier.

Alternatively, positive electrode 54 may be coupled to non-inverting input 102 and bias provided by resistor 100 coupled between inverting input 98 and the positive supply voltage, as in FIG. 12.

Figure 13:
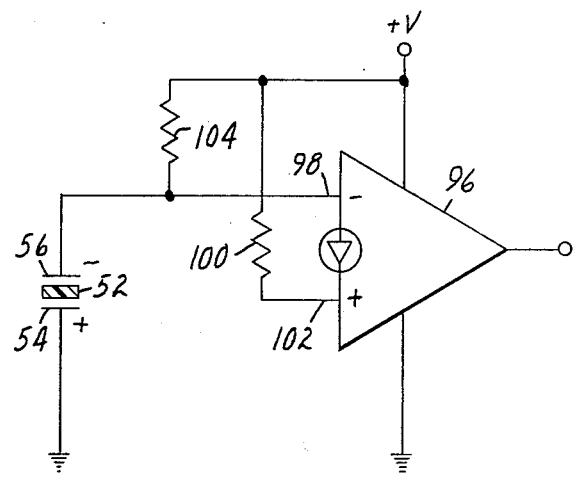
FIG. 13 is an electrical sensing circuit featuring another alternative "Norton" operational amplifier.

A similar arrangement is shown in FIG. 13 where the polarity of the piezoelectric polymer film is reversed from FIGS. 11 and 12. Here, positive electrode 54 is coupled to signal ground while negative electrode 56 is coupled to inverting input 98. Again bias is provided by resistor 100 coupled between non-inverting input 102 and the positive supply voltage. To account to the change in polarity, however, additional bias resistor 104 is required coupled between negative electrode 56 and the positive supply voltage. Both resistors 100 and 104 are preferably in the range of 500 kilohms to 10 megaohms and may be adjusted or made adjustable to provide for variable sensitivity.

Figure 14:
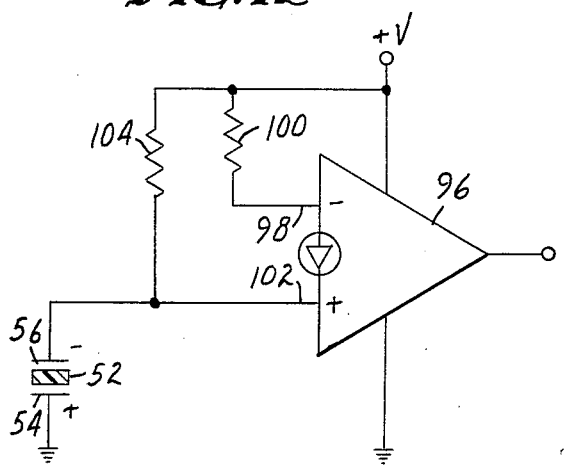
FIG. 14 is an electrical sensing circuit featuring still another alternative "Norton" operational amplifier.

Again alternatively, negative electrode 56 may be coupled to non-inverting input 102 and bias provided by resistor 100 coupled between inverting input 98 and the postive supply voltage and by resistor 104 coupled between negative electrode 56 and the positive supply voltage, as in FIG. 14.

Of course, it is to be recognized that the polarity of the piezoelectric polymer film 52 may be reversed merely by straining the film in the opposite direction. Or the reverse polarity may be achieved by making the electrical sensing circuit responsive to the release of strain to the film rather than commencement of strain to the film.

It is also to be recognized that while two electrodes are always shown in FIGS. 4 through 14, in all cases it is contemplated that the electrical connection desired is between an electrode (either positive or negative responsive) and its associated conductive plane.

Of course, it is recognized that the described circuits are merely exemplary of a whole variety of electric sensing circuits which may be made available in order to sense the small voltage signal or small current generated by the induced strain on the piezoelectric material.

One of the electrical sensing circuits described may be connected to one of the electrodes on each electrode layer illustrated and described in FIGS. 1 through 3 to provide for sensing of a signal on two of the electrodes (a row and a column) to identify a single switch position which has been activated, thus a matrix encoded non-contact piezoelectric switch.

Thus, it can be seen that there has been shown and described a novel apparatus for producing electrical signals. It is to be understood, however, that various changes, modifications, and substitutions in the form and details of the described apparatus can be made by those skilled in the art without departing from the scope of the invention as defined by the following claims.

What is claimed is:

1. A pressure sensitive apparatus for producing an amplified electrical signal on one of two electrodes comprising:
    an insulating layer;
    two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and
    an electrical sensing circuit coupled to said one of said two electrodes and coupled to said conductive plane for amplifying one of said electrical signals, said conductive plane being utilized as signal ground;
    said electrical sensing circuit being a high impedance interface to said one of said two electrodes which provides for an adjustable sensitivity;
    said electrical sensing circuit having an MOS digital gate adapted to be powered from a power source having a voltage and a signal ground and having a signal input and a signal output, said signal input coupled to said one of said two electrodes; a first resistance coupled between said voltage and said signal ground and having an adjustable tap to bias said digital gate; and a second resistance coupled between said signal input and said adjustable tap to provide an adjustment of the bias of said digital gate.

2. A pressure sensitive apparatus for producing an amplified electrical signal on one of two electrodes comprising:
    an insulating layer;
    two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and
    an electrical sensing circuit coupled to said one of said two electrodes and coupled to said conductive plane for amplifying one of said electrical signals, and conductive plane being utilized as signal ground;

said electrical sensing circuit being a high impedance interface to said one of said two electrodes which provides for an adjustable sensitivity;

said one of said two electrodes being positively charged with respect to said conductive plane and said electrical circuit having a comparator adapted to be powered from a power source having a voltage and a signal ground and having first and second signal inputs and a signal output, said first signal input being coupled to said one of said two electrodes, a first resistance coupled between said voltage and said second signal input, a second resistance coupled between said second signal input and said signal ground and having an adjustable tape and a third resistance coupled between said first signal input and said adjustable tap such that said first, second and third resistance provide an adjustable bias for said comparator.

3. A pressure sensitive apparatus for producing an amplified electrical signal on one of two electrodes comprising:

an insulating layer;

two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and an electrical sensing circuit coupled to said one of said two electrodes and coupled to said conductive plane for amplifying one of said electrical signals, said conductive plane being utilized as signal ground;

said electrical sensing circuit being a high impedance interface to said one of said two electrodes which provides for an adjustable sensitivity;

said one of said two electrodes being negatively charged with respect to said conductive plane and said electrical circuit having a comparator adapted to be powered from a power source having a voltage and a signal ground and having first and second signal inputs and a signal output, said first signal input coupled to said one of said two electrodes; a first resistance coupled between said second signal input and signal ground, a second resistance coupled between said second signal input and said voltage and having an adjustable tap and a third resistance coupled between said first signal input and said adjustable tap such that said first, second and third resistance provide an adjustable bias for said comparator.

4. A pressure sensitive apparatus for producing an amplified electrical signal on one of two electrodes comprising:

an insulating layer;

two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and an electrical sensing circuit coupled to one of said two electrodes and coupled to said conductive plane for amplifying one of said electrical signals, said conductive plane being utilized as signal ground;

said electrical sensing circuit being a high impedance interface to said one of said two electrodes which provides for an adjustable sensitivity;

said one of said two electrodes being positively charged with respect to said conductive plane and said electrical circuit having a comparator adapted to be powered from a power source having a positive voltage and a negative voltage and having first and second signal inputs and a signal output, said first signal input coupled to said one of said two electrodes and said second signal input coupled to signal ground, a first resistance coupled between said second signal input and said negative voltage and having an adjustable tap and a second resistance coupled between first signal input and said adjustable tap such that said first and second resistances provide an adjustable bias for said comparator.

5. A pressure sensitive apparatus for producing an amplified electrical signal on one of two electrodes comprising:

an insulating layer;

two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and an electrical sensing circuit coupled to one of said two electrodes and coupled to said conductive plane for amplifying one of said electrical signals, said conductive plane being utilized as signal ground;

said electrical sensing circuit being a high impedance interface to said one of said two electrodes which provides for an adjustable sensitivity;

said one of said two electrodes being negatively charged with respect to said conductive plane and said electrical circuit having a comparator adapted to be powered from a power source having a positive voltage and a negative voltage and having first and second signal inputs and a signal output, said first signal input coupled to said one of said two electrodes and said second signal input coupled to signal input coupled to signal ground, a first resistance coupled between said second signal input and said positive voltage and having an adjustable tap and a second resistance coupled between first signal input and said adjustable tap such that said first resistance and said second resistance provide an adjustable bias for said comparator.

6. A pressure sensitive apparatus for producing an amplified electrical signal on one of two electrodes comprising:

an insulating layer;

two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and an electrical sensing circuit coupled to said one of said two electrodes and coupled to said conductive plane for amplifying one of said electrical signals, said conductive plane being utilized as signal ground;

said electrical sensing circuit being a low impedance interface to said one of said two electrodes;

said one of said two electrodes being positively charged with respect to said conductive plane and said electrical circuit having an operational amplifier adapted to be powered from a power source having a positive voltage and a negative voltage, said operational amplifier having an inverting input and a non-inverting input and a signal output, said inverting input being coupled to said one of said two electrodes and said non-inverting input being coupled to signal ground, a first resistance being coupled between said signal output and said inverting input, and a second resistance being coupled between said inverting input and said negative voltage.

7. A pressure sensitive apparatus for producing an amplified electrical signal on one of two electrodes comprising:

an insulating layer;

two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and an electrical sensing circuit coupled to said one of said two electrodes and coupled to said conductive plane for amplifying one of said electrical signals, said conductive plane being utilized as signal ground;

said electrical sensing circuit being a low impedance interface to said one of said two electrodes said one of said two electrodes being negatively charged with respect to said conductive plane and wherein said electrical circuit having an operational amplifier adapted to be powered from a power source having a positive voltage and a negative voltage, said operational amplifier having an inverting input and a non-inverting input and a signal output, said inverting input being coupled to said one of said two electrodes and said non-inverting input being coupled to signal ground, a first resistance being coupled between said signal output and said inverting input, and a second resistance being coupled between said inverting input and said positive voltage.

8. A pressure sensitive apparatus for producing an amplified electrical signal on one of two electrodes comprising:

an insulating layer;

two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and an electrical sensing circuit coupled to said one of said two electrodes and coupled to said conductive plane for amplifying one of said electrical signals, said conductive plane being utilized as signal ground;

said electrical sensing circuit being a low impedance interface to said one of said two electrodes;

said one of said two electrodes being positively charged with respect to said conductive plane and said electrical circuit having a "Norton" amplifier adapted to be powered from a power source having a positive voltage and a signal ground, said "Norton" amplifier having an inverting input and a non-inverting input and a signal output, said inverting input being coupled to said one of said two electrodes, and a resistance coupled between said non-inverting input and said positive voltage.

9. A pressure sensitive apparatus for producing an amplified electrical signal on one of two electrodes comprising:

an insulating layer;

two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and an electrical sensing circuit coupled to said one of said two electrodes and coupled to said conductive plane for amplifying one of said electrical signals, said conductive plane being utilized as signal ground;

said electrical sensing circuit being a low impedance interface to said one of said two electrodes;

said one of said two electrodes being negatively charged with respect to said conductive plane and said electrical circuit having a "Norton" amplifier adapted to be powered from a power source having a positive voltage and a signal ground, said "Norton" amplifier having an inverting input and a non-inverting input and a signal output, said inverting input being coupled to said one of said two electrodes, a first resistance coupled between said non-inverting input and said positive voltage, and a second resistance coupled between said inverting input and said positive voltage, where said first resistance is greater than said second resistance.

10. A pressure sensitive apparatus for producing an amplified electrical signal on one of two electrodes comprising:

an insulating layer;

two piezoelectric polymer films, each having one of said two electrodes on one surface thereof and having a conductive plane on the other surface thereof adapted to be connected to ground, one disposed on each side of said insulating layer with said electrodes in closest proximity to said insulating film; and an electrical sensing circuit coupled to said one of said two electrodes and coupled to said conductive plane for amplifying one of said electrical signals, said conductive plane being utilized as signal ground;

said electrical sensing circuit being a low impedance interface to said one of said two electrodes, said one of said two electrodes being negatively charged with respect to said conductive plane and said electrical circuit having a "Norton" amplifier adapted to be powered from a power source having a positive voltage and a signal ground, said "Norton" amplifier having an inverting input and a non-inverting input and a signal output, said non-inverting input being coupled to said one of said two electrodes, and a first resistance coupled between said inverting input and said positive voltage, and a second resistance coupled between said non-inverting input and said positive voltage, where said first resistance is greater than said second resistance.

* * * * *